United States Patent
Wayburn et al.

(10) Patent No.: US 6,543,246 B2
(45) Date of Patent: Apr. 8, 2003

(54) INTEGRATED CIRCUIT COOLING APPARATUS

(75) Inventors: Lewis S. Wayburn, Irmo, SC (US); Derek E. Gage, Irmo, SC (US); Andrew M. Hayes, Columbia, SC (US); R. Walton Barker, Lexington, SC (US); David W. Niles, Irmo, SC (US)

(73) Assignee: Kryotech, Inc., West Columbia, SC (US)

( * ) Notice: Subject to any disclaimer, the term of this patent is extended or adjusted under 35 U.S.C. 154(b) by 0 days.

(21) Appl. No.: 09/911,865

(22) Filed: Jul. 24, 2001

(65) Prior Publication Data

US 2003/0019234 A1 Jan. 30, 2003

(51) Int. Cl.[7] .............................. F25D 23/12; H05K 7/20
(52) U.S. Cl. ....................................... 62/259.2; 361/701
(58) Field of Search ................................ 62/259.2, 276, 62/701; 361/700, 719, 710

(56) References Cited

U.S. PATENT DOCUMENTS

| | | | | |
|---|---|---|---|---|
| 5,365,749 A | * | 11/1994 | Porter | 62/259.2 |
| 5,463,872 A | * | 11/1995 | Vader et al. | 62/51.1 |
| 5,574,627 A | | 11/1996 | Porter | |
| 5,581,441 A | * | 12/1996 | Porter | 361/701 |
| 6,054,676 A | * | 4/2000 | Wall et al. | 219/209 |
| 6,205,796 B1 | * | 3/2001 | Chu et al. | 62/94 |
| 6,205,803 B1 | * | 3/2001 | Scaringe | 62/259.2 |
| 6,292,365 B1 | * | 9/2001 | Ashiwake et al. | 361/700 |
| 6,324,058 B1 | * | 11/2001 | Hsiao | 361/699 |
| 6,347,036 B1 | * | 2/2002 | Yeager et al. | 361/687 |

OTHER PUBLICATIONS

International Search Report for corresponding PCT application, dated Sep. 11, 2002, 4 pages.
Service Manual entitled "KryoTech—KryoTech Cool Athlon™ System Service Guide—Cool Computing," copyright date 1999.

* cited by examiner

Primary Examiner—William C. Doerrler
(74) Attorney, Agent, or Firm—Nelson Mullins Riley & Scarborough

(57) ABSTRACT

An apparatus for cooling a computer's microprocessor includes a thermal housing having a receiving aperture in alignment with the microprocessor. A thermal head is inserted into and guided by the receiving aperture such that a cooled surface of the thermal head will be in thermal contact with the microprocessor. The thermal head defines a flow channel for passage of a refrigerant fluid so as to cause cooling at the cooled surface. A clamping arrangement is attached to the mounting structure to maintain the thermal head in operative position. The apparatus further includes a refrigeration system in fluid communication with the flow channel of the thermal head to supply refrigerant fluid thereto.

68 Claims, 8 Drawing Sheets

INTEGRATED CIRCUIT COOLING APPARATUS

BACKGROUND OF THE INVENTION

The present invention generally relates to integrated circuit devices such as the central processing units (CPUs) of computers. More particularly, the invention relates to the cooling of such integrated circuits for enhanced electronic performance.

It is well known in the electronics industry that cooling integrated circuit devices to below ambient temperature will substantially improve the efficiency and speed at which such devices can operate. Such cooling is particularly beneficial in microprocessors that form the CPU of modern day computers. For example, it has been found that the performance of a desktop computer can be significantly improved by cooling the CPU to temperatures of −40° C. or below.

In the past, various techniques have been proposed for cooling CPUs and other integrated circuit devices to temperatures below ambient. For example, KryoTech, Inc., the assignee of the present invention, has previously developed a refrigeration system for cooling a CPU in a desktop computer. This refrigeration system operated by a circulating refrigerant fluid to a thermal head engaging the CPU.

The thermal head defined a flow channel through which the refrigerant fluid would pass as it circulated around the closed loop of the refrigeration system. Due to its design, the thermal head functioned as an evaporator where the refrigerant fluid was converted from liquid to gaseous form. In accordance with known thermodynamic principles, thermal energy was thus removed from the location of the CPU. The gaseous refrigerant, drawn from the evaporator by a compressor, was then fed back to a condenser where the thermal energy was removed.

As one skilled in the art will appreciate, the use of a refrigeration system in conjunction with electronic equipment raises a variety of issues. For example, undesirable condensation can develop on the computer's motherboard unless appropriate preventative measures are taken. To provide a secure seal around the thermal head, the housing in which the thermal head is located has been permanently affixed to the motherboard itself. Such an arrangement, however, makes removal of the motherboard difficult after the refrigeration system has been installed in the computer. This permanent attachment may also require opening of the refrigeration system in order to repair or replace the motherboard.

SUMMARY OF THE INVENTION

According to one aspect, the present invention provides an apparatus for cooling an electronic device. The apparatus comprises a mounting structure having a receiving aperture in alignment with the electronic device. A thermal head is adapted to be inserted into and guided by the receiving aperture such that a cooled surface of the thermal head will be in thermal contact with the electronic device. The thermal head defines a flow channel for passage of a refrigerant fluid so as to cause cooling at the cooled surface. A clamping arrangement is attached to the mounting structure to maintain the thermal head in operative position. The apparatus further includes a refrigeration system in fluid communication with the flow channel of the thermal head to supply refrigerant fluid thereto.

In some exemplary embodiments, the mounting structure comprises a thermal housing having an interior in which the electronic device is located. The thermal housing serves to isolate the interior thereof from an ambient environment. Often, it will be desirable to form the thermal housing of thermally conductive metal, such as aluminum. This permits, for example, the provision of a heater element for heating an outer surface of the thermal housing so as to prevent condensation from forming thereon. Advantageously, the mounting structure may be fixed to a circuit board on which the electronic device is mounted.

Embodiments are contemplated in which the thermal head is axially movable in the receiving aperture of the mounting structure. In such embodiments, the clamping arrangement may include a spring element to urge the thermal head into engagement with the electronic device. The thermal head may further include a peripheral seal engaging an inner wall of the receiving aperture. In this regard, the receiving aperture and the thermal head may each advantageously have a generally cylindrical configuration.

In some exemplary embodiments, the thermal head will be removably secured by the clamping arrangement with respect to the mounting structure. The clamping arrangement may include a clamping flange movable with respect to the thermal head. The clamping flange in such embodiments may being fixed with respect to the mounting structure when attached thereto. Often, it will be desirable to further equip the clamping arrangement with a clamping collar movable with respect to the clamping flange and the thermal head. A spring element, located between the clamping collar and the thermal head, may also be provided to urge the thermal head into engagement with the electronic device.

Often, it will be desirable to make the inlet tube and outlet tubes through which refrigerant fluid flows to and from the thermal head sufficiently flexible to provide mechanical isolation to the thermal head. For example, the outlet tube may be a corrugated metal tube with the inlet tube being a capillary tube. In some exemplary embodiments, the flow channel of the thermal head has a configuration generally characterized by a plurality of arcuate and concentric passage segments.

Other aspects of the present invention are provided by a thermal housing for attachment to a planar circuit board having thereon at least one electronic device to be cooled. The thermal housing comprises a removable first housing member located on a first side of the circuit board. The first housing member defines an interior in which the electronic device is located. A removable second housing member is located on a second side of the circuit board opposite to the first housing member such that the circuit board will be sandwiched therebetween. At least the first housing member is formed of a thermally conductive material. Furthermore, a first heater element is associated with the first housing member to heat an outer surface thereof so as to prevent condensation from forming thereon. Preferably, the first housing member in such embodiments may define a first groove on its outer surface in which the first heater element is located.

Often, it will be desirable to also construct the second housing member of a thermally conductive material. In such embodiments, a second heater element may be associated with the second housing member. For example, the first and second housing members may each be formed of aluminum. First and second resilient seals may be respectively located between the first and second housing members and the circuit board.

Often, it may be desirable to configure the first housing member so as to have a block portion defining a receiving aperture in which a thermal head of a cooling apparatus is inserted. A wall portion of the first housing member will define a thin wall for engagement with the circuit board. Preferably, the thin wall of the first housing member will be configured to define a path around electronic components mounted to the circuit board. A desiccant material may be located in the interior of the first housing member to absorb moisture located therein.

Still further aspects of the present invention are achieved by an apparatus comprising a planar circuit board having thereon at least one electronic device to be cooled. A thermal housing having a removable first housing member and a removable second housing member is also provided. The first housing member is located on a first side of the circuit board and defines an interior in which the electronic device is located. The first housing member further defines a receiving aperture in alignment with the electronic device. A thermal head of the apparatus is adapted to be inserted into and guided by the receiving aperture such that a cooled surface of the thermal head will be in thermal contact with the electronic device. The second housing member is located on a second side of the circuit board opposite to the first housing member such that the circuit board will be sandwiched therebetween.

Additional aspects of the present invention are achieved by an evaporator for a cooling apparatus used for cooling an electronic device. The evaporator comprises a thermal head having a cooled surface for thermal contact with the electronic device. The thermal head defines a flow channel for passage of a refrigerant fluid so as to cause cooling at the cooled surface. The flow channel has a configuration generally characterized by a plurality of arcuate and concentric passage segments. The flow channel of the thermal head further has an inlet and outlet for respective ingress and egress of the refrigerant fluid. An inlet tube is provided in fluid communication with the inlet and an outlet tube is provided in fluid communication with the outlet.

In some preferred embodiments, the flow channel has scalloped sidewalls characteristic of the flow channel being formed by interconnected drill holes. Furthermore, the thermal head may comprise a first portion and a second portion made of disparate metals which are connected together to yield an integral structure. For example, the first portion of the thermal head may be formed of brass and the second portion of the thermal head may be formed of copper.

Other aspects of the present invention are provided by an apparatus for cooling an electronic device. The apparatus comprises a mounting structure having a receiving aperture in alignment with the electronic device. A thermal head is axially movable in the receiving aperture such that a cooled surface of the thermal head will be guided into thermal contact with the electronic device. The thermal head defines a flow channel for passage of a refrigerant fluid so as to cause cooling at the cooled surface. A clamping arrangement is attached to the mounting structure to maintain the thermal head in operative position. The clamping arrangement includes a spring element, such as a helical wave spring, to urge the thermal head into engagement with the electronic device.

Further aspects of the present invention are achieved by an evaporator for a cooling apparatus used for cooling an electronic device. The evaporator comprises a thermal head having a cooled surface for thermal contact with the electronic device. The thermal head defines a flow channel for passage of a refrigerant fluid so as to cause cooling at the cooled surface. The flow channel of the thermal head has an inlet and outlet for respective ingress and egress of the refrigerant fluid. An inlet tube and an outlet tube are provided in fluid communication with the inlet and outlet of the thermal head, respectively. The inlet tube is located inside of the outlet tube for a predetermined length so as to provide a counterflow heat exchanger. In exemplary embodiments, the predetermined length in which the two tubes are coaxial will be at least approximately one (1) foot.

Still further aspects of the present invention are achieved by apparatus for cooling an electronic device. The apparatus comprises a thermal housing having an interior in which the electronic device is located. The thermal housing serves to isolate the interior thereof from an ambient environment. A desiccant material is located in the interior of the thermal housing to absorb moisture located therein. A thermal head having a cooled surface in thermal contact with the electronic device is also provided. The thermal head defines a flow channel for passage of a refrigerant fluid so as to cause cooling at the cooled surface.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
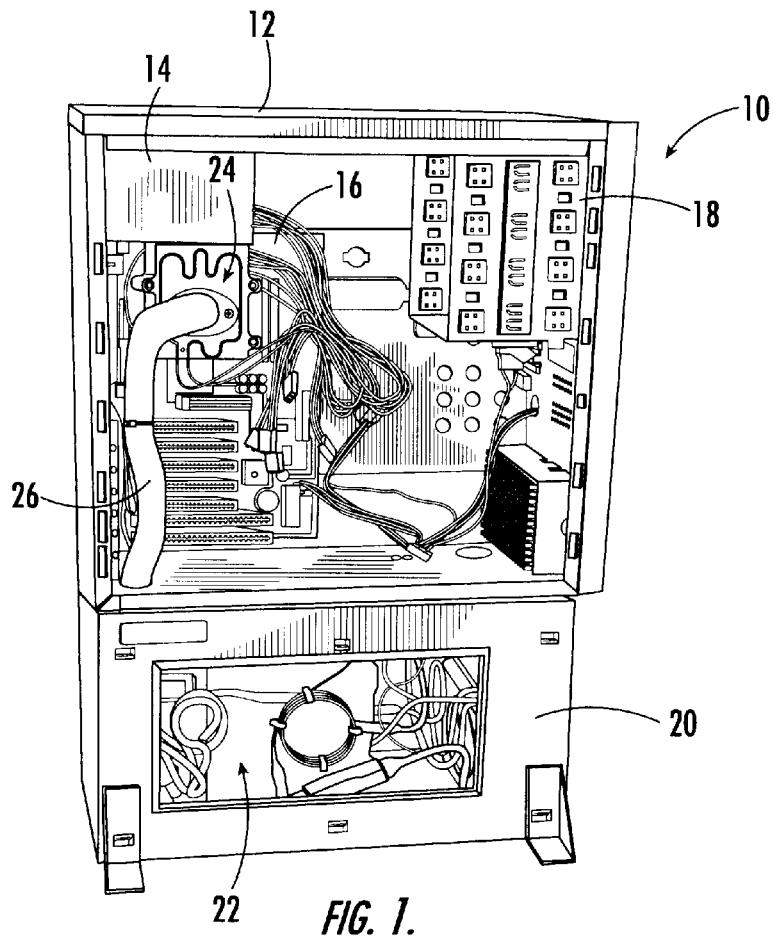
FIG. 1 is a perspective view of a computer having a refrigeration system constructed in accordance with the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only and is not intended as limiting the broader aspects of the present invention, which broader aspects are embodied in the exemplary constructions.

FIG. 1 illustrates a computer 10 having a main housing 12 in which various components are located, such as power supply 14 and motherboard 16. A disk drive rack 18 is located near the front of housing 12 for receipt of various disk drives as may be installed in well-known manner. A lower housing 20 is also provided to contain components of a refrigeration system 22.

In this case, refrigeration system 22 operates to cool the computer's main microprocessor, also referred to as the CPU, which is mounted on motherboard 16. Toward this end, refrigeration system 22 includes a thermal housing 24 in which the CPU is hermetically contained. Moisture within the thermal housing is removed to prevent the formation of ice crystals therein as the microprocessor is cooled. Refrigerant fluid is supplied to and from the location of the microprocessor via a thermal bus 26.

Figure 2:
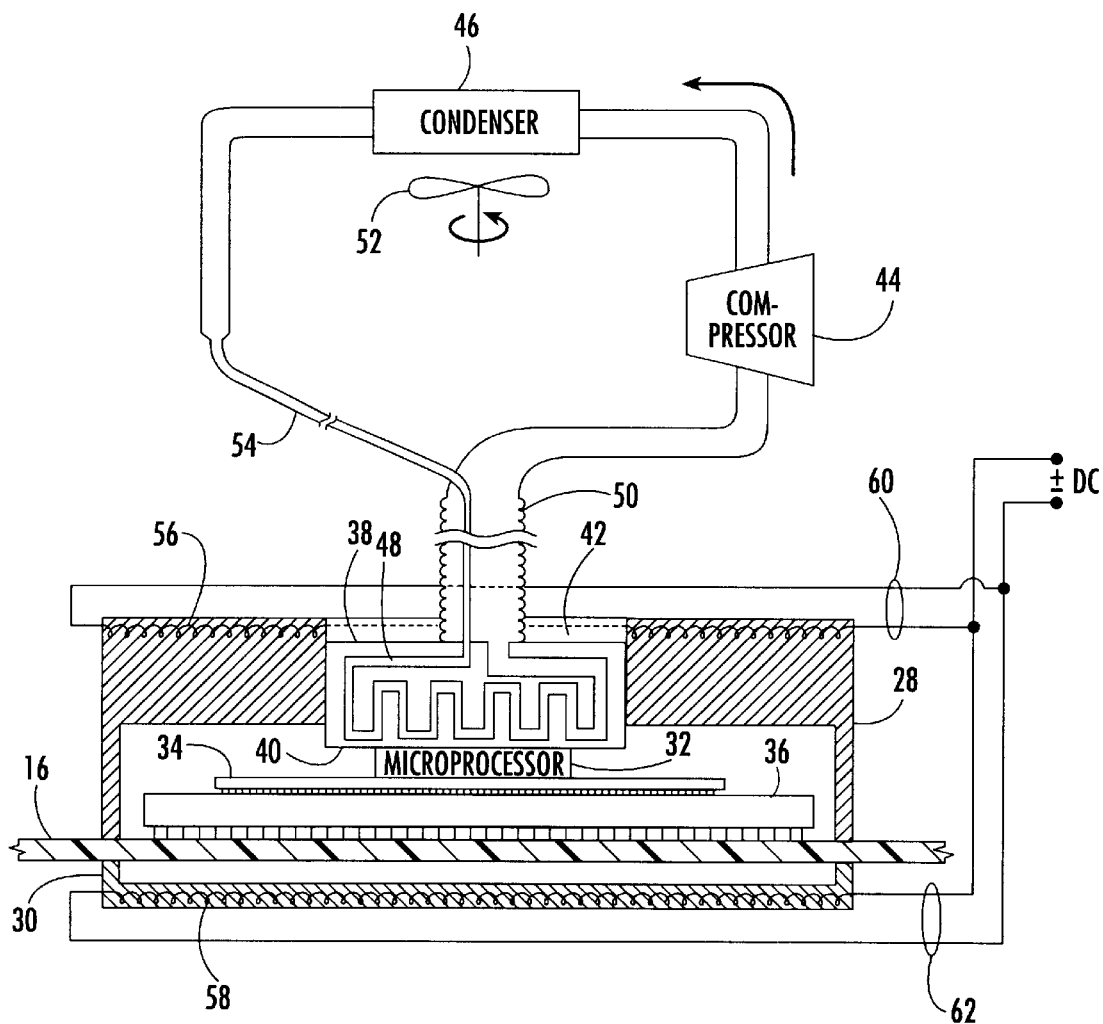
FIG. 2 is a diagrammatic representation of the refrigeration system that is installed in the computer of FIG. 1.

Referring now to FIG. 2, the operation of refrigeration system 22 can be most easily explained. As shown, the thermal housing includes a first housing member 28 located on the "front" of motherboard 16. A second housing member 30 may be located on the "back" of motherboard 16 opposite to first housing member 28. As a result, motherboard 16 is sandwiched between housing members 28 and 30.

In this example, the computer's microprocessor 32 is fixed to a pin carrier 34 in well-known manner. Carrier 34 is plugged into a pin socket 36 which includes its own pins soldered to conductive traces on motherboard 16. As shown, microprocessor 32, along with carrier 34 and socket 36, is located in an interior space defined by first housing member 28. Second housing member 30 functions to hermetically seal the location where the pins of socket 36 extend through motherboard 16.

The refrigeration system includes a thermal head 38 having a cooled surface 40 in thermal contact with microprocessor 32. In this case, thermal head 38 is inserted into a receiving aperture 42 defined in first housing member 28. Receiving aperture 42 is aligned with microprocessor 32, as shown, so as to axially guide thermal head 38 into operative position. As will be explained more fully below, means are preferably provided to urge cooled surface 40 into engagement with the microprocessor.

Thermal head 38 forms the evaporator of a refrigeration system also including a compressor 44 and a condenser 46. The refrigeration system employs a refrigerant fluid, such as R404a, R507a, R134a and the like, circulated so as to alternately absorb and release thermal energy. This occurs when the refrigerant fluid changes between gaseous and liquid states in accordance with the well-known refrigeration cycle.

In particular, the refrigerant fluid absorbs excess thermal energy at the location of microprocessor 32 when refrigerant fluid "evaporates" from a liquid state to a gaseous state. This evaporation occurs in a fluid flow channel 48 defined in thermal head 38. The low pressure gas exiting thermal head 38 is then fed along outlet tube 50 to compressor 44. The resulting high pressure gas is then fed to condenser 46, where accumulated thermal energy dissipates. The refrigerant fluid is thus condensed to liquid form.

A fan 52 forces ambient air across the coils of condenser 46 to facilitate heat exchange. In presently preferred embodiments, fan 52 may be driven by a variable speed motor to maintain a desired pressure level at the evaporator's inlet. This technique is described in more detail in commonly-assigned application Ser. No. 09/911,870, entitled "APPARATUS AND METHOD FOR CONTROLLING THE TEMPERATURE OF AN INTEGRATED CIRCUIT DEVICE" filed on Jul. 24, 2001, naming Charles B. Wall, Terry Craps, Charles R. Schmidt and Matthew F. W. Brown as inventors thereof.

In this case, high pressure liquid from condenser 46 is forced through a capillary tube 54 for a predetermined distance during its return trip back to thermal head 38. Capillary tube 54 thus serves as the inlet tube back into thermal head 38.

An "expansion valve" is formed in this example by the interface of capillary tube 54 and fluid flow channel 48. Specifically, the refrigerant in liquid form undergoes a pressure drop as it transverses along the small inner diameter of capillary tube 54 and enters the larger enclosed volume at the inlet of flow channel 48. This pressure drop causes a reduction in temperature as predicted by the ideal gas law.

As one skilled in the art will appreciate, insulation material may be provided surrounding the tubing of the coolant loop where refrigerant fluid is below the local ambient dew point. The length and inner diameter of the tubing depends on its location in the coolant loop and the specific requirements of the particular application. For example, capillary tube 54 may have a length of about ten feet or more and an inner diameter of approximately 0.026 inches in many embodiments of the invention. It should be understood by one of ordinary skill in the art that different thermal demands may require certain variations, and these variations are within the scope of the present invention.

According to conventional thinking in the art, the microprocessor to be cooled should be located in an insulated thermal housing in order to prevent the formation of condensation on the outside. In presently preferred embodiments of the invention, however, both first housing member 28 and second housing member 30 may preferably be formed of a thermally conductive material. While aluminum will often be preferred, other thermally conductive materials, such as other metals, impregnated polymers and the like, may also be used. This is possible in part because air in the interior of thermal housing 24 already functions as an exceptional insulator.

The use of a thermally conductive material allows heating elements 56 and 58 to be provided directly on the outer surfaces of housing members 28 and 30. The thermally conductive nature of housing members 28 and 30 causes the thermal energy provided by heating elements 56 and 58 to envelop the outer surfaces thereof to prevent the formation of condensation. Electrical energy is supplied to heating elements 56 and 58 from the chiller's power supply via connection wires 60 and 62.

Figure 3:
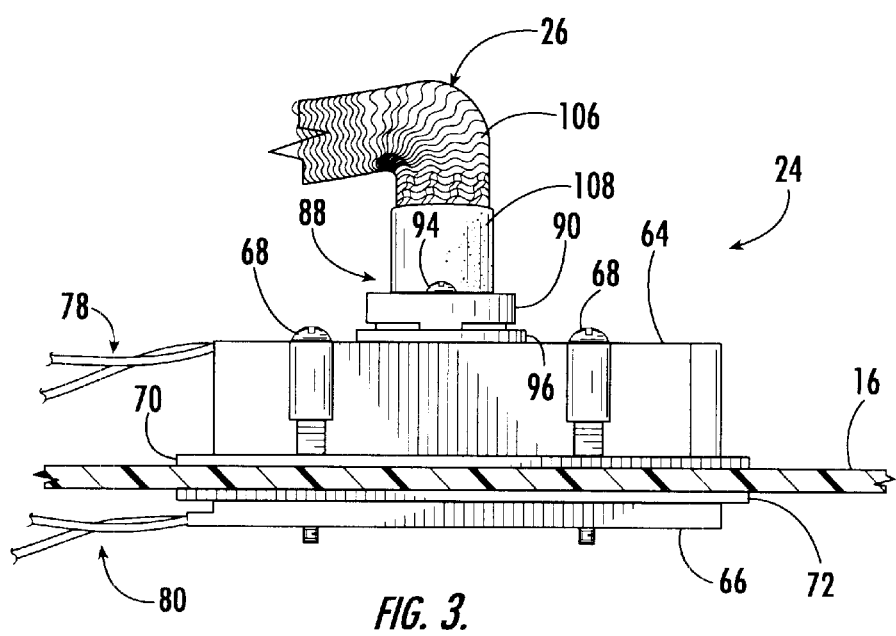
FIG. 3 is a side view of a preferred thermal housing assembly mounted to the motherboard of the computer of FIG. 1.
Figure 4:
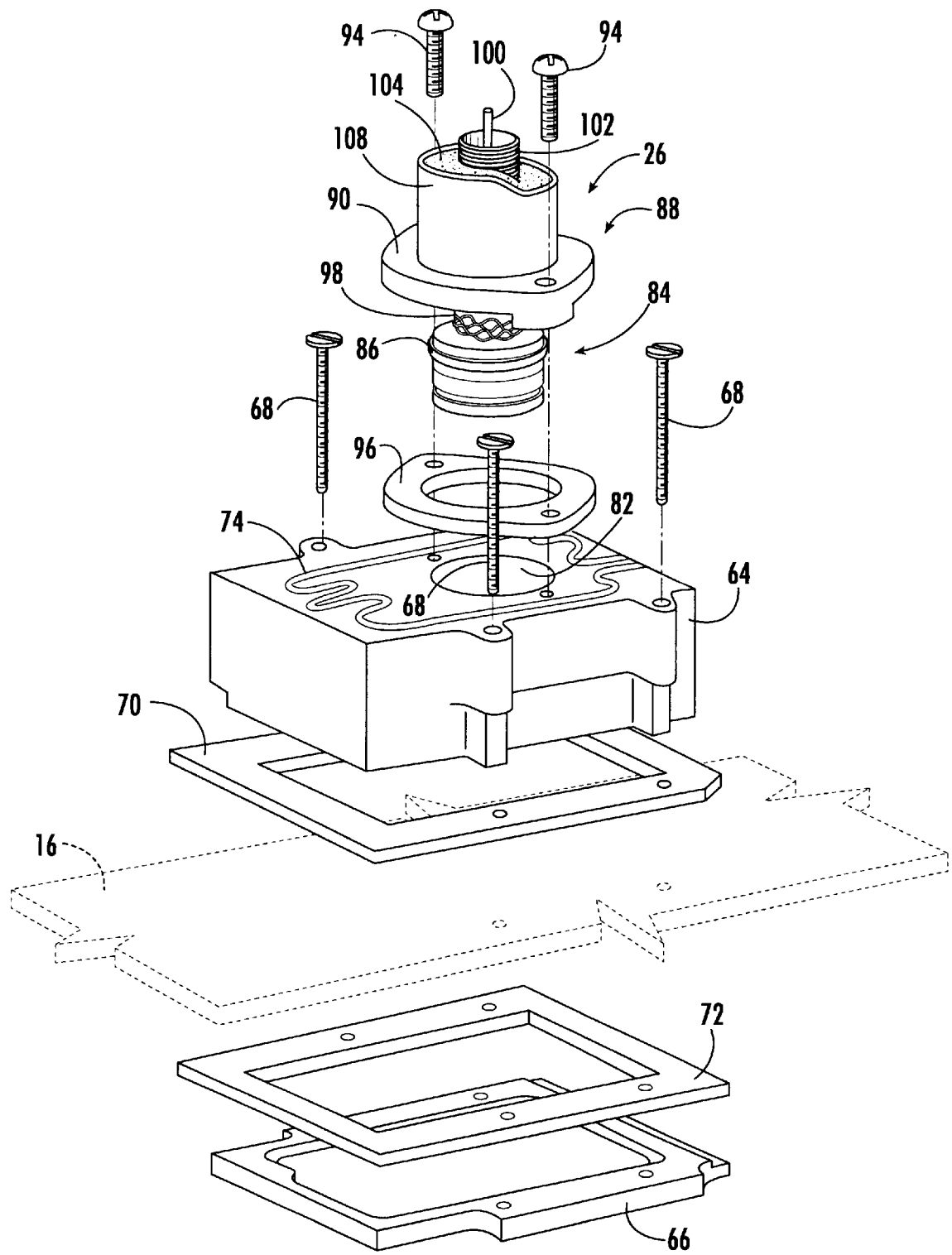
FIG. 4 is an exploded view of the thermal housing assembly of FIG. 3 showing various components thereof.

FIGS. 3 and 4 illustrate one preferred manner in which thermal housing 24 may be constructed. In this example, a first housing member 64 and a second housing member 66 are secured to motherboard 16 utilizing a plurality of through bolts 68. Advantageously, through bolts 68 may extend through respective holes that are already provided in motherboard 16 for mounting a heat sink for the microprocessor. Seal elements 70 and 72 are preferably located between respective housing members 64 and 66 and motherboard 16. In this case, seal elements 70 and 72 may be formed as cut seals made from a suitable resilient material, such as silicone.

Figure 12:
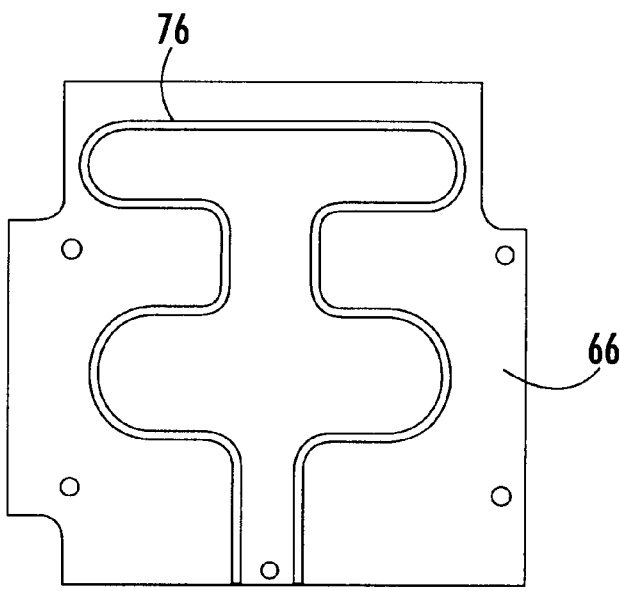
FIG. 12 is a plan view of the outside surface of the second housing member of the thermal housing assembly of FIG. 3.

In this example, first housing member defines a groove 74 on its outer surface for receipt of a heater element therein. As shown in FIG. 12, second housing member 66 similarly defines a groove 76 on its outer surface. Preferably, the heater elements may be constructed as resistive wire located within a compressible insulator. The grooves may thus be sized and configured so that the compressible insulator will serve to retain the heater element in position after being inserted into the associated groove. Referring again to FIG. 3, power is supplied to the respective heater by conductive wires 78 and 80.

Figure 5:
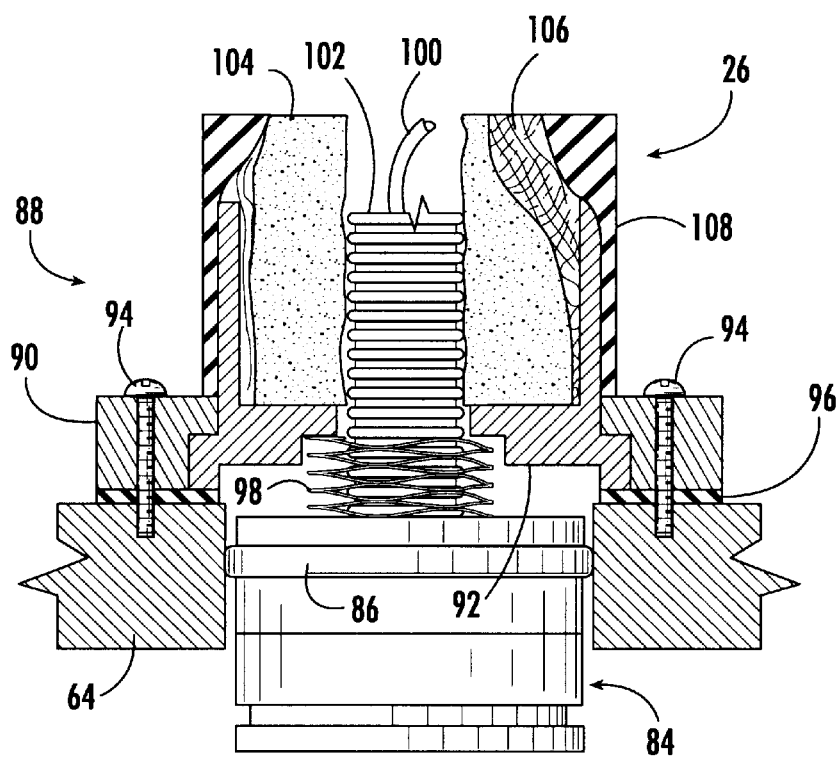
FIG. 5 is an enlarged view of a preferred thermal head positioned in the thermal housing assembly of FIG. 3.

As shown in FIG. 4, first housing member 64 defines a receiving aperture 82 aligned with the microprocessor to be cooled. Referring now also to FIG. 5, a thermal head 84, located at the end of thermal bus 26, is inserted into receiving aperture 82. In this example, both receiving aperture 82 and thermal head 84 are configured having a cylindrical shape. It will be appreciated, however, that other suitable shapes such as ovals are also contemplated within the scope of the present invention. A resilient seal 86 (in this example an O-ring seal) is preferably located about thermal head 84 for engaging the inner bore of receiving aperture 82. As a result, seal 86 self-seals thermal head 84 upon insertion into receiving aperture 82 and further isolates the interior of the thermal housing from the ambient environment.

It will be appreciated that first housing member 64 serves as a mounting structure to support thermal head 84 in effective thermal contact with the microprocessor. Once correctly positioned, thermal head 84 is maintained in this position by a clamping arrangement 88. In this example, clamping arrangement 88 includes a clamping flange 90 and a clamping collar 92, both of which are independently movable with respect to thermal head 84. Clamping flange 90 engages clamping collar 92, and the two are secured to the outer surface of housing member 64 by suitable means, such as screws 94. As shown, a seal element 96 is preferably located between clamping flange 90 and the surface of housing member 64. Seal element 96 may be a cut seal similar to seal elements 70 and 72 discussed above.

Means such as a suitable spring are preferably provided to urge thermal head 84 into engagement with the microprocessor or other electronic device. In this case, for example, a helical wave spring 98 is located between clamping collar 92 and the upper surface of thermal head 84. In addition, the tubing through which refrigerant fluid flows to and from thermal head 84 will preferably be sufficiently flexible so as to provide mechanical isolation. This will prevent thermal head 84 from becoming unseated from the top surface of the microprocessor even if thermal bus 26 is bumped or otherwise somewhat moved. In addition, the flexible nature of the tubing provides gimballing to compensate for slight variations in the plane of the thermal head or the microprocessor itself.

In this regard, the inlet tube into thermal head 84 may be a capillary tube 100 as described above. In presently preferred embodiments, capillary tube 100 may be formed of copper. To provide sufficient flexibility with a metal tube, the larger outlet tube may be a corrugated tube 102. If the outlet tube is made of metal, a preferred material for such tube is Bronze/C5100. Other suitable materials, such as flexible polymer, may also be used.

Figure 6:
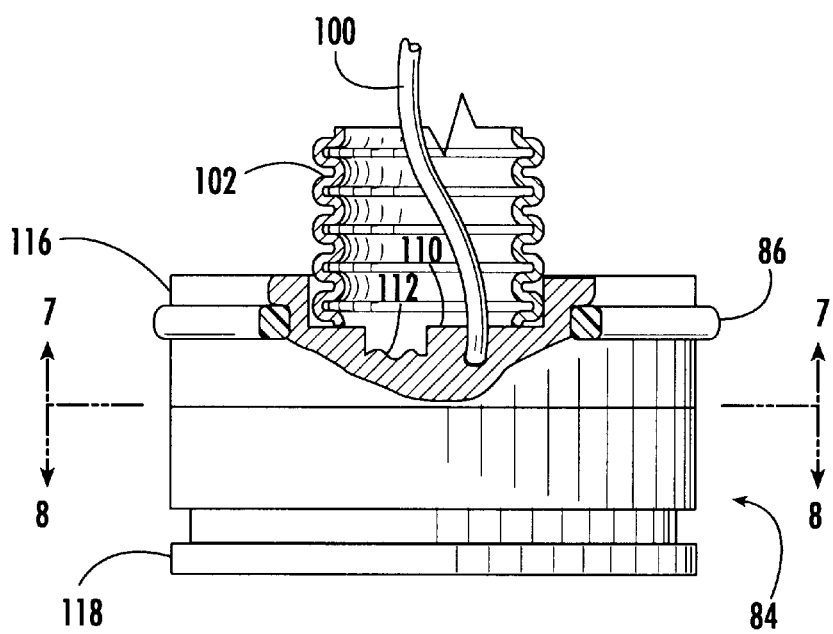
FIG. 6 is a partial sectional view of the thermal head shown in FIG. 5.

As can be seen most clearly in FIG. 6, capillary tube 100 is located inside of corrugated tube 102 in this embodiment at the location where the two are attached to thermal head 84. Preferably, capillary tube 100 remains inside of corrugated tube 102 for a sufficient distance along thermal bus 26 so as to provide an effective counterflow heat exchanger. For example, capillary tube 100 may be located inside of corrugated tube 102 for at least approximately one (1) foot in presently preferred embodiments of the invention. This arrangement is advantageous to yield more work from the refrigerant.

Referring now again to FIGS. 3–5, certain additional details regarding thermal bus 26 will be explained. As shown, corrugated tube 102 (containing capillary tube 100) is preferably surrounded by a suitable insulative material, such as a flexible foam 104. In this case, foam 104 is in turn surrounded by a braided textile casing 106. As can be most clearly seen in FIG. 5, foam 104 and casing 106 are inserted into an annular wall of collar 92. A flexible boot 108 may be located around the outside of this annular wall to provide a "finished" appearance. As one skilled in the art will appreciate, boot 108 may be made of plastic, rubber or other suitable material.

As shown in FIG. 6, corrugated tube 102 is seated in a recess 110 defined in the top surface of thermal head 84. In this manner, corrugated tube 102 will be in fluid communication with an outlet 112 for refrigerant fluid exiting the evaporator channel. Similarly, capillary tube 100 is connected so as to be in fluid communication with evaporator inlet 114 (FIG. 7).

In some presently preferred embodiments, thermal head is formed of upper and lower portions 116 and 118 which have been connected together to yield an integral structure. This two-portion construction facilitates the manufacture of the fluid flow channel defined therein and allows the two portions to be constructed from disparate metals or other suitable material. For example, upper portion 116 may be formed from brass with lower portion 118 being formed from copper. Copper is desirable for the lower portion due to its significantly higher thermal conductivity in relation to brass. Brazing is an effective technique for bonding the brass and copper portions together.

Figure 7:
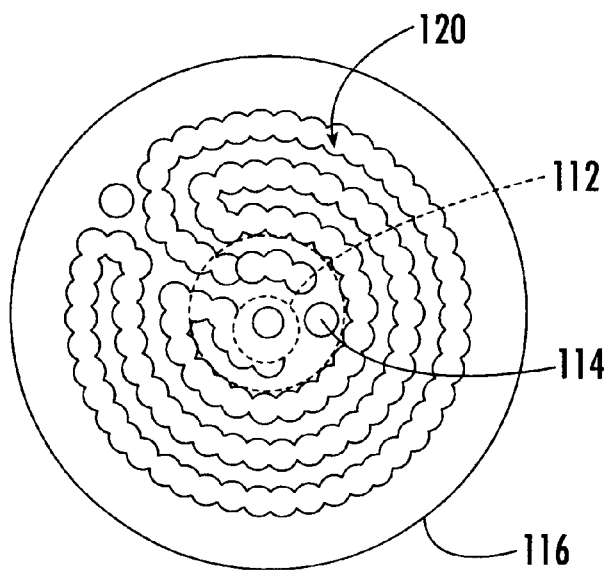
FIG. 7 is a cross-sectional view taken along line 7—7 of FIG. 6.
Figure 8:
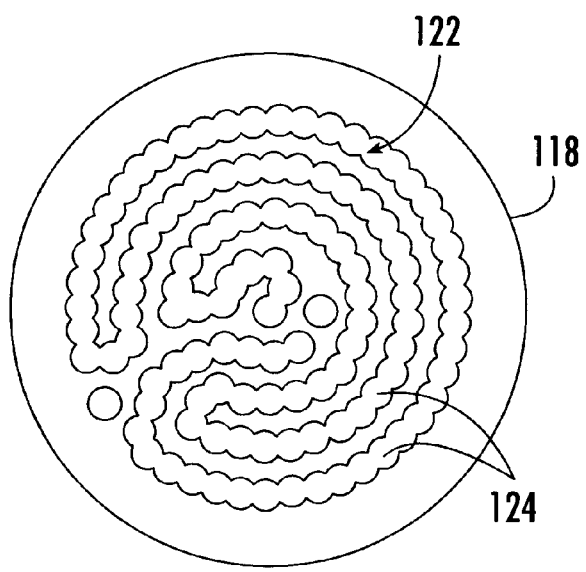
FIG. 8 is a cross-sectional view taken along line 8—8 of FIG. 6.

Referring now to FIGS. 7 and 8, the configuration of the flow channel can be most easily explained. As shown in FIG. 7, an upper half 120 of the flow channel is formed in upper portion 116 by plunge drilling interconnected drill holes in a predetermined pattern. A lower half 122 of the flow channel is similarly formed in lower portion 118. When upper portion 116 and lower portion 118 are joined together, upper and lower halves 120 and 122 will be in register so as to form the complete flow channel of thermal head 84.

In the illustrated embodiment, the flow channel is generally characterized by a plurality of arcuate and concentric passage segments, such as those indicated at 124 in FIG. 8. As a result of these curves, centripetal force advantageously "throws" the refrigerant (in particular the liquid part) against the sidewalls of the flow channel as it flows, thereby enhancing boiling and heat transfer. This creates turbulence which facilitates the heat transfer process. Heat transfer is further improved by the scalloped sidewalls produced by the drilling procedure discussed above. The scalloped sidewalls provide greater surface area and more turbulence than a similar, but nonscalloped passage. In addition, the scalloped peaks produce desirable coolant boiling.

Figure 9:
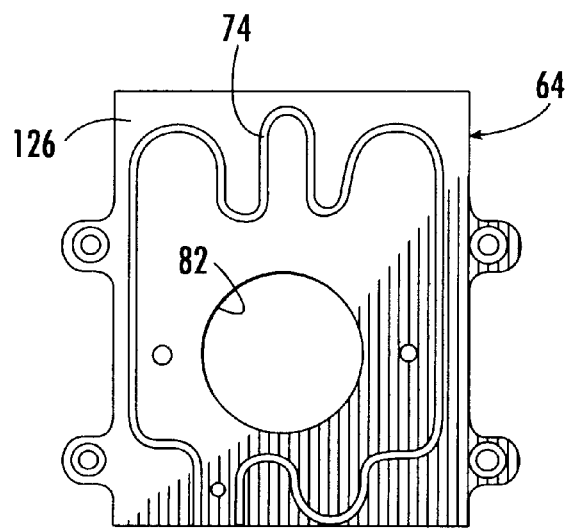
FIG. 9 is a plan view of the outside surface of the first housing member of the thermal housing assembly of FIG. 3.
Figure 10:
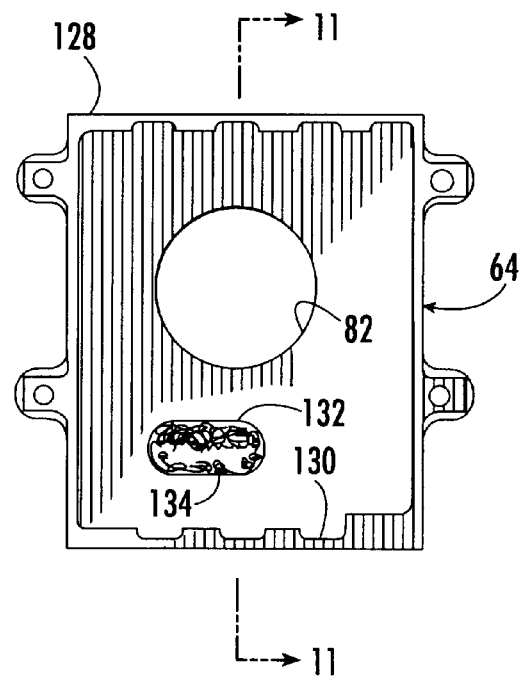
FIG. 10 is a plan view of the inside surface of the first housing member of the thermal housing assembly of FIG. 3.
Figure 11:
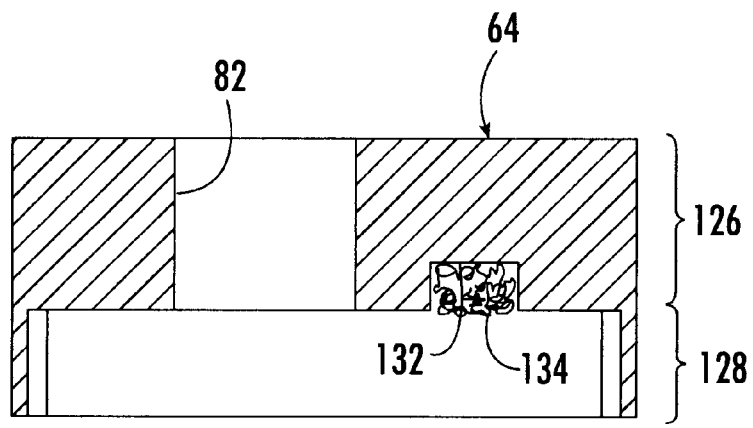
FIG. 11 is a cross-sectional view taken along line 11—11 of FIG. 10.

Referring now to FIGS. 9–11, housing portion 64 is preferably formed having an upper block portion 126 in which receiving aperture 82 is defined. A lower wall portion 128 defines the interior space in which the microprocessor is housed. It will be appreciated that a rigid material such as metal allows the thin wall to have features such as cutouts 130 (FIG. 10) for avoiding smaller components mounted directly to the motherboard. In this manner, the wall can desirably find a clear path around components mounted on the motherboard without resting on top of them. This customization of the thermal housing allows it to function as an application-specific mounting adapter for an otherwise widely-used refrigeration system.

FIGS. 11 and 12 illustrate an additional desirable feature of housing member 64. As can be seen, block portion 126 may further define a recess 132 in which a desiccant material 134 is located. Desiccant material 134, which may be any suitable desiccant, such as molecular sieve, absorbs errant moisture that may somehow seep into the interior of housing member 64.

Figure 13:
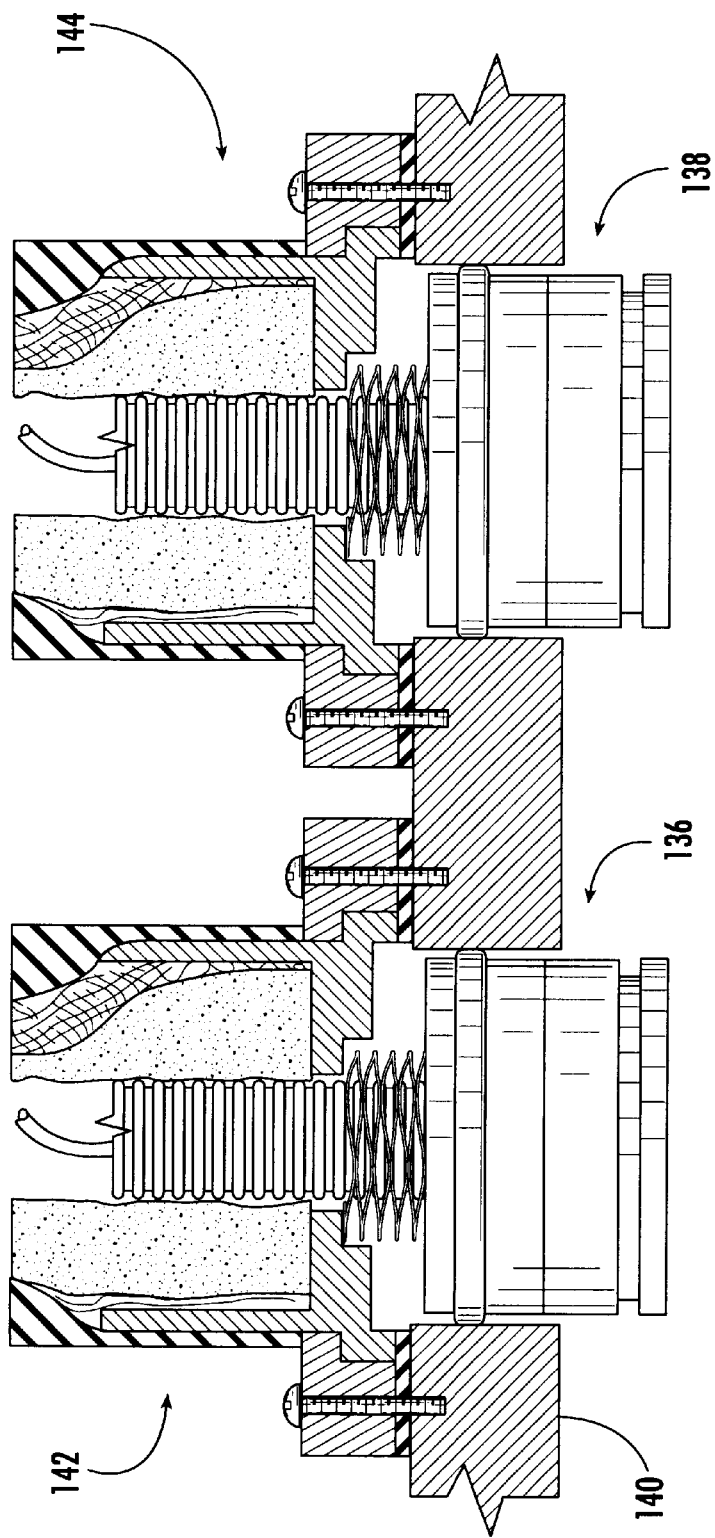
FIG. 13 is an enlarged view, partially in section, showing a pair of thermal heads mounted in a single mounting structure for respectively cooling dual microprocessors.

Modern computer systems, particularly those intended for relatively demanding applications, are sometimes equipped with more than one microprocessor. Referring now to FIG. 13, the present invention permits respective thermal heads 136 and 138 for the individual microprocessors to be conveniently mounted in a single mounting structure 140. For example, mounting structure 140 may be a single housing member having a respective receiving aperture for each of the thermal heads. In this case, an individual thermal bus 142 and 144 is provided for each of thermal heads 136 and 138, respectively. This permits thermal heads 136 and 138 to be individually removed from the mounting structure without disturbing the other.

It can be seen that the present invention provides various novel features for a microprocessor refrigeration system. While preferred embodiments of the invention have been shown and described, modifications and variations may be made thereto by those of skill in the art without departing from the spirit and scope of the present invention. It should also be understood that aspects of various embodiments may be interchanged both in whole or in part. Furthermore, those of ordinary skill in the art will appreciate that the foregoing description is by way of example only, and is not intended to be limitative of the invention so further described in the appended claims.

What is claimed is:

1. An apparatus for cooling an electronic device, said apparatus comprising:
    a mounting structure having a receiving aperture in axial alignment with a top surface of said electronic device;
    a thermal head movable with respect to said mounting structure, said thermal head adapted to be inserted into and guided by said receiving aperture such that a cooled surface of said thermal head will be in thermal contact with said top surface of said electronic device;
    said thermal head defining a flow channel for passage of a refrigerant fluid so as to cause cooling at said cooled surface;
    a clamping arrangement attached to said mounting structure to maintain said thermal head in operative position; and
    a refrigeration system in fluid communication with said flow channel of said thermal head to supply refrigerant fluid thereto.

2. An apparatus as set forth in claim 1, wherein said mounting structure comprises a thermal housing having an interior in which said electronic device is located, said thermal housing serving to isolate said interior thereof from an ambient environment.

3. An apparatus as set forth in claim 2, wherein said thermal housing is formed of thermally conductive material.

4. An apparatus as set forth in claim 3, wherein said mounting structure is formed of aluminum.

5. An apparatus as set forth in claim 3, wherein said mounting structure includes a heater element operative to heat an outer surface thereof so as to prevent condensation from forming thereon.

6. An apparatus as set forth in claim 3, wherein said mounting structure is fixed to a circuit board on which said electronic device is mounted.

7. An apparatus as set forth in claim 1, wherein said thermal head is axially movable in said receiving aperture, said clamping arrangement including a spring element to urge said thermal head into engagement with said electronic device.

8. An apparatus as set forth in claim 7, wherein said thermal head includes a peripheral seal engaging an inner wall of said receiving aperture.

9. An apparatus as set forth in claim 8, wherein said receiving aperture and said thermal head each have a generally cylindrical configuration.

10. An apparatus as set forth in claim 1, wherein said thermal head is removably secured by said clamping arrangement with respect to said mounting structure.

11. An apparatus as set forth in claim 10, wherein said clamping arrangement includes a clamping flange movable with respect to said thermal head, said clamping flange being fixed with respect to said mounting structure when attached thereto.

12. An apparatus for cooling an electronic device, said apparatus comprising:
    a mounting structure having a receiving aperture in alignment with said electronic device;
    a thermal head adapted to be inserted into and guided by said receiving aperture such that a cooled surface of said thermal head will be in thermal contact with said electronic device;
    said thermal head defining a flow channel for passage of a refrigerant fluid so as to cause cooling at said cooled surface;
    a clamping arrangement attached to said mounting structure to removably secure said thermal head in operative position with respect to said mounting structure, said clamping arrangement including a clamping flange movable with respect to said thermal head but fixed with respect to said mounting structure when attached thereto, said clamping arrangement further including a clamping collar movable with respect to said clamping flange and said thermal head; and
    a refrigeration system in fluid communication with said flow channel of said thermal head to supply refrigerant fluid thereto.

13. An apparatus as set forth in claim 12, wherein said clamping arrangement further comprises a spring element to urge said thermal head into engagement with said electronic device, said spring element being located between said clamping collar and said thermal head.

14. An apparatus as set forth in claim 1, wherein said refrigerant fluid is respectively conducted to and from said thermal head via an inlet and an outlet tube, said inlet tube being located inside of said outlet tube.

15. An apparatus as set forth in claim 14, wherein said inlet tube and said outlet tube are sufficiently flexible to provide mechanical isolation to said thermal head.

16. An apparatus as set forth in claim 15, wherein said outlet tube is a corrugated metal tube.

17. An apparatus as set forth in claim 15, wherein said inlet tube is a capillary tube.

18. An apparatus as set forth in claim 1, wherein said flow channel of said thermal head has a configuration generally characterized by a plurality of arcuate and concentric passage segments.

19. A thermal housing for attachment to a planar circuit board having thereon at least one electronic device to be cooled, said thermal housing comprising:

a removable first housing member located on a first side of said circuit board, said first housing member defining an interior in which said electronic device is located so as to define an air pocket surrounding said electronic device;

a removable second housing member located on a second side of said circuit board opposite to said first housing member such that said circuit board will be sandwiched therebetween;

at least said first housing member being formed substantially entirely of a thermally conductive material, said electronic device being thermally insulated from said first housing member by said air pocket; and a first heater element associated with said first housing member to heat an outer surface thereof so as to prevent condensation from forming thereon.

20. A thermal housing for attachment to a planar circuit board having thereon at least one electronic device to be cooled, said thermal housing comprising:

a removable first housing member located on a first side of said circuit board, said first housing member defining an interior in which said electronic device is located;

a removable second housing member located on a second side of said circuit board opposite to said first housing member such that said circuit board will be sandwiched therebetween;

at least said first housing member being formed of a thermally conductive material;

a first heater element associated with said first housing member to heat an outer surface thereof so as to prevent condensation from forming thereon; and said first housing member defining a first groove on said outer surface, said first heater element being located in said groove.

21. A thermal housing as set forth in claim 19, wherein said second housing member is formed of a thermally conductive material.

22. A thermal housing as set forth in claim 21, further comprising a second heater element associated with said second housing member to heat an outer surface thereof so as to prevent condensation from forming thereon.

23. A thermal housing as set forth in claim 21, wherein said first and second housing members are formed of aluminum.

24. A thermal housing as set forth in claim 19, further comprising first and second resilient seals respectively located between said first and second housing members and said circuit board.

25. A thermal housing as set forth in claim 24, wherein said first and second housing members are secured in position on said circuit board by a plurality of through-bolts.

26. A thermal housing as set forth in claim 19, wherein said first housing member has a block portion defining a receiving aperture in which a thermal head of a cooling apparatus is inserted and a wall portion defining a thin wall for engagement with said circuit board.

27. A thermal housing for attachment to a planar circuit board having thereon at least one electronic device to be cooled, said thermal housing comprising:

a removable first housing member located on a first side of said circuit board, said first housing member defining an interior in which said electronic device is located;

said first housing member having a block portion defining a receiving aperture in which a thermal head of a cooling apparatus is inserted and a wall portion defining a thin wall for engagement with said circuit board, said thin wall of said first housing member being configured to define a path around electronic components mounted to said circuit board;

a removable second housing member located on a second side of said circuit board opposite to said first housing member such that said circuit board will be sandwiched therebetween;

at least said first housing member being formed of a thermally conductive material; and a first heater element associated with said first housing member to heat an outer surface thereof so as to prevent condensation from forming thereon.

28. A thermal housing as set forth in claim 27, wherein said first housing member is formed entirely of metal.

29. A thermal housing as set forth in claim 26, wherein said receiving aperture has a cylindrical configuration.

30. A thermal housing as set forth in claim 19, further comprising a desiccant material located in said interior of said first housing member to absorb moisture located therein.

31. An apparatus comprising:

a planar circuit board having thereon at least one electronic device to be cooled;

a thermal housing having a removable first housing member and a removable second housing member;

said first housing member located on a first side of said circuit board and defining an interior in which said electronic device is located;

said first housing member further defining a receiving aperture in alignment with said electronic device;

a thermal head adapted to be inserted into and guided by said receiving aperture such that a cooled surface of said thermal head will be in thermal contact with said electronic device, said thermal head being axially movable in said receiving aperture; and said second housing member being located on a second side of said circuit board opposite to said first housing member such that said circuit board will be sandwiched therebetween.

32. An apparatus as set forth in claim 31, wherein each of said housing members is constructed of a thermally conductive material.

33. An apparatus as set forth in claim 32, wherein said first and second housing members are formed of aluminum.

34. An apparatus as set forth in claim 32, further comprising a respective heater element associated with each of said housing members to heat an outer surface thereof so as to prevent condensation from forming thereon.

35. An apparatus comprising:

a planar circuit board having thereon at least one electronic device to be cooled;

a thermal housing having a removable first housing member and a removable second housing member, each of said housing members being constructed of a thermally conductive material;

said first housing member located on a first side of said circuit board and defining an interior in which said electronic device is located;

said first housing member further defining a receiving aperture in alignment with said electronic device;

a thermal head adapted to be inserted into and guided by said receiving aperture such that a cooled surface of said thermal head will be in thermal contact with said electronic device;

said second housing member being located on a second side of said circuit board opposite to said first housing member such that said circuit board will be sandwiched therebetween;

a respective heater element associated with each of said housing members to heat an outer surface thereof so as to prevent condensation from forming thereon; and said housing members each defining a groove on said outer surface, said respective heater element being located in said groove.

36. An apparatus as set forth in claim 31, further comprising first and second resilient seals respectively located between said first and second housing members and said circuit board.

37. An apparatus as set forth in claim 36, wherein said first and second housing members are secured in position on said circuit board by a plurality of through-bolts.

38. An apparatus as set forth in claim 31, wherein said first housing member has a block portion defining a receiving aperture in which a thermal head of a cooling apparatus is inserted and a wall portion defining a thin wall for engagement with said circuit board.

39. An apparatus as set forth in claim 38, wherein said thin wall of said first housing member is configured to define a path around electronic components mounted to said circuit board.

40. An apparatus as set forth in claim 38, further comprising a desiccant material located in said interior of said first housing member to absorb moisture located therein.

41. An apparatus as set forth in claim 31, further comprising means for urging said thermal head into engagement with said electronic device.

42. An apparatus as set forth in claim 31, wherein said thermal head includes a peripheral seal engaging an inner wall of said receiving aperture.

43. An apparatus as set forth in claim 42, wherein said receiving aperture and said thermal head each have a generally cylindrical configuration.

44. An apparatus as set forth in claim 43, wherein said thermal head is removably secured with respect to said first housing member.

45. An evaporator for a cooling apparatus used for cooling an electronic device, said evaporator comprising:

a thermal head having a cooled surface for thermal contact with said electronic device;

said thermal head defining a flow channel for passage of a refrigerant fluid so as to cause cooling at said cooled surface, said flow channel having a configuration generally characterized by a plurality of arcuate and concentric passage segments, said flow channel having scalloped sidewalls characteristic of said flow channel being formed by interconnected drill holes;

said flow channel of said thermal head having an inlet and outlet for respective ingress and egress of said refrigerant fluid;

an inlet tube in fluid communication with said inlet of said thermal head; and an outlet tube in fluid communication with said outlet of said thermal head.

46. An evaporator as set forth in claim 45, wherein said thermal head comprises a first portion and a second portion made of disparate metals, said first portion and said second portion being connected together to yield an integral structure.

47. An evaporator as set forth in claim 46, wherein said first portion of said thermal head is formed of brass and said second portion of said thermal head is formed of copper.

48. An evaporator as set forth in claim 47, wherein said first portion and said second portion of said thermal head are brazed together to yield said integral structure.

49. An evaporator as set forth in claim 45, wherein said thermal head defines a peripheral groove about an outer surface thereof, said peripheral groove having a peripheral seal located therein.

50. An evaporator as set forth in claim 49, wherein said thermal head has a generally cylindrical configuration.

51. An evaporator as set forth in claim 45, wherein said inlet tube is located inside of said outlet tube.

52. An evaporator as set forth in claim 51, wherein said outlet tube is a corrugated metal tube.

53. An evaporator as set forth in claim 51, wherein said inlet tube is a capillary tube.

54. An apparatus for cooling an electronic device, said apparatus comprising:

a mounting structure having a receiving aperture in alignment with said electronic device;

a thermal head axially movable in said receiving aperture such that a cooled surface of said thermal head will be guided in thermal contact with said electronic device;

said thermal head defining a flow passage for passage of a refrigerant fluid so as to cause cooling at said cooled surface; and a clamping arrangement attached to said mounting structure to maintain said thermal head in operative position, said clamping arrangement including a helical wave spring to urge said thermal head into engagement with said electronic device.

55. An apparatus as set forth in claim 54, wherein said mounting structure is fixed to a circuit board on which said electronic device is mounted.

56. An apparatus as set forth in claim 55, wherein said mounting structure comprises a thermal housing having an interior in which said electronic device is located, said thermal housing serving to isolate said interior thereof from an ambient environment.

57. An apparatus for cooling an electronic device, said apparatus comprising:

a mounting structure having a receiving aperture in alignment with said electronic device;

a thermal head axially movable in said receiving aperture such that a cooled surface of said thermal head will be guided in thermal contact with said electronic device, said thermal head including a peripheral seal engaging an inner wall of said receiving aperture;

said thermal head defining a flow passage for passage of a refrigerant fluid so as to cause cooling at said cooled surface; and a clamping arrangement attached to said mounting structure to maintain said thermal head in operative position, said clamping arrangement including a spring element to urge said thermal head into engagement with said electronic device.

58. An apparatus as set forth in claim 57, wherein said receiving aperture and said thermal head each have a generally cylindrical configuration.

59. An apparatus as set forth in claim 58, wherein said thermal head is removably secured with respect to said mounting structure by said clamping arrangement.

60. An apparatus as set forth in claim 54, wherein an inlet tube and an outlet tube are connected to said thermal head for respectively conducting said refrigerant fluid to and from said flow channel, said tubes being sufficiently flexible to provide mechanical isolation to thermal head.

61. An apparatus as set forth in claim 60, wherein said outlet tube is a corrugated metal tube.

62. An apparatus as set forth in claim 61, wherein said inlet tube is a capillary tube.

63. An apparatus as set forth in claim 62, wherein said inlet tube is located inside of said outlet tube.

64. An apparatus for cooling an electronic device, said apparatus comprising:

- a thermal housing fixed to a circuit board on which said electronic device is mounted and having an interior in which said electronic device is located, said thermal housing serving to surround and cover said electronic device and isolate said interior thereof from an ambient environment;
- a desiccant material located in said interior of said thermal housing to absorb moisture located therein;
- a thermal head having a cooled surface in thermal contact with said electronic device; and
- said thermal head defining a flow channel for passage of a refrigerant fluid so as to cause cooling at said cooled surface.

65. An apparatus as set forth in claim 64, wherein said thermal housing is removably secured with respect to said circuit board.

66. An apparatus as set forth in claim 65, further comprising a resilient seal located between said thermal housing and said circuit board.

67. An apparatus as set forth in claim 66, wherein said thermal housing is formed of a thermally conductive material.

68. An apparatus as set forth in claim 67, further comprising a heater element associated with said thermal housing to heat an outer surface thereof so as to prevent condensation from forming thereon.

* * * * *